United States Patent
Ivanov et al.

(10) Patent No.: US 12,489,405 B2
(45) Date of Patent: Dec. 2, 2025

(54) AMPLIFIER OUTPUT STAGE CIRCUITRY

(71) Applicant: Texas Instruments Incorporated, Dallas, TX (US)

(72) Inventors: Vadim Valerievich Ivanov, Dallas, TX (US); Srinivas Kumar Pulijala, Tucson, AZ (US); Piyush Deepak Kaslikar, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 644 days.

(21) Appl. No.: 17/482,195

(22) Filed: Sep. 22, 2021

(65) Prior Publication Data
US 2023/0092097 A1 Mar. 23, 2023

(51) Int. Cl.
*H03F 3/45* (2006.01)
*H03F 1/30* (2006.01)
*H03F 3/30* (2006.01)

(52) U.S. Cl.
CPC ......... *H03F 1/301* (2013.01); *H03F 3/45179* (2013.01); *H03F 3/3022* (2013.01); *H03F 3/45071* (2013.01); *H03F 3/45183* (2013.01); *H03F 2200/447* (2013.01)

(58) Field of Classification Search
CPC ............... H03F 1/301; H03F 3/45179; H03F 2200/447; H03F 3/3028; H03F 3/45291; H03F 3/343; H03F 3/345; H03F 3/45071; H03F 3/45183; H03F 3/45085; H03F 3/3022; H03F 3/45192; G05F 3/265
USPC ......................................... 330/255, 257, 288
See application file for complete search history.

(56) References Cited

U.S. PATENT DOCUMENTS

| | | | | |
|---|---|---|---|---|
| 6,218,900 B1* | 4/2001 | Nolan | ...................... | H03F 1/52 327/52 |
| 6,542,033 B2* | 4/2003 | Maejima | ............. | H03F 3/45192 330/261 |
| 6,828,855 B1* | 12/2004 | Wang | .................... | H03F 3/3023 330/253 |
| 7,466,201 B1* | 12/2008 | Ivanov | .................. | H03F 3/3022 330/264 |
| 7,570,113 B2* | 8/2009 | Welty | ....................... | H03F 1/52 330/253 |
| 8,319,553 B1* | 11/2012 | Ivanov | .................... | H03F 3/456 330/253 |
| 10,461,707 B2* | 10/2019 | Ivanov | .................. | H03F 1/0233 |
| 11,811,373 B2* | 11/2023 | Nakai | ....................... | H03F 1/02 |

* cited by examiner

*Primary Examiner* — Khanh V Nguyen
(74) *Attorney, Agent, or Firm* — Mandy Barsilai Fernandez; Frank D. Cimino (57) ABSTRACT

An example apparatus includes: a folded cascode circuit including a first input terminal, a second input terminal, a first output terminal, and a second output terminal; a first feedback loop including a third output terminal, the third output terminal coupled to the first output terminal; a second feedback loop including a fourth output terminal, the fourth output terminal coupled to the second output terminal; and a first driver including a first control terminal and a fifth output terminal, the first control terminal coupled to the third output terminal; and a second driver including a second control terminal and a sixth output terminal, the second control terminal coupled to the fourth output terminal, the sixth output terminal coupled to the fifth output terminal.

14 Claims, 6 Drawing Sheets

| 404 TEST | 408 STRESS CONDITION | I_M$_P$OUT 416 / 412 | | 424 PERCENT CHANGE |
|---|---|---|---|---|
| | | FRESH | 420 STRESSED | |
| 428 Open_Loop_Comparator | Vp = 5V; Vn = 0V | 14.81 µA | 14.67 µA | -0.94% |
| 432 Output_Short_to_AVSS | Vout SHORTED TO GROUND VIA 0.1 OHM RESISTOR | 14.81 µA | 14.66 µA | -1.01% |
| 436 Output_Short_to_AVDD | Vout SHORTED TO AVDD VIA 0.1 OHM RESISTOR | 14.81 µA | 15.05 µA | 1.62% |

FIG. 4A

| 440 TEST | 444 STRESS CONDITION | I_M$_N$OUT 452 / 448 | | 460 PERCENT CHANGE |
|---|---|---|---|---|
| | | FRESH | 456 STRESSED | |
| 464 Open_Loop_Comparator | Vp = 5V; Vn = 0V | 14.81 µA | 14.67 µA | -0.94% |
| 468 Output_Short_to_AVSS | Vout SHORTED TO GROUND VIA 0.1 OHM RESISTOR | 14.81 µA | 14.66 µA | -1.01% |
| 472 Output_Short_to_AVDD | Vout SHORTED TO AVDD VIA 0.1 OHM RESISTOR | 14.81 µA | 15.05 µA | 1.62% |

AMPLIFIER OUTPUT STAGE CIRCUITRY

TECHNICAL FIELD

This description relates generally to circuits, and more particularly to amplifier output stage circuitry.

BACKGROUND

Operational amplifier output stage operation may be classified as Class A, Class B, or Class AB. The gain of a Class AB output stage is required to remain consistent even when under zero load current conditions. Class AB operation includes a minimum gain requirement resulting in frequency stability with capacitive loads and low distortion of sinusoidal signals. Low voltage supply (e.g., voltage supply VDD) may result in variations in the performance of a Class AB output stage.

Negative Bias Temperature Instability (NBTI) and Positive Bias Temperature Instability (PBTI) are phenomena observed in some metal-oxide-semiconductor field effect transistors (MOSFETs) that causes performance instability in the affected MOSFETs. NBTI and PBTI may occur due to aging of the affected devices, elevated device temperature and/or the gate biasing of the affected devices. P-channel metal-oxide semiconductor (PMOS) transistor are more susceptible to that experiences extended use over time, may be subject to negative bias temperature instab. NBTI results in the threshold voltage, required to enable a PMOS transistor, to vary as an interface charge builds on a subsurface of a gate of a transistor over time. The NBTI effects on Class AB operation may result in increasing variation in the operation of the amplifier.

SUMMARY

For an NBTI insensitive Class AB amplifier output stage, an example apparatus includes a folded cascode circuit including a non-inverting input terminal, an inverting input terminal, a first output terminal, and a second output terminal; a first feedback loop including a third output terminal, the third output terminal coupled to the first output terminal; a second feedback loop including a fourth output terminal, the fourth output terminal coupled to the second output terminal; and a first driver including a first control terminal and a fifth output terminal, the first control terminal coupled to the third output terminal; and a second driver including a second control terminal and a sixth output terminal, the second control terminal coupled to the fourth output terminal, the sixth output terminal coupled to the fifth output terminal.

DETAILED DESCRIPTION

Operational amplifier output stage operation may be classified as a Class A, Class B, or a Class AB. An operational amplifier with a Class AB output stage is useful to maintain an output signal gain (e.g., transconductance) during zero (or near zero) load current conditions. Minimum transconductance (gm) is important for frequency stability of the amplifier for capacitive loads and for reduction of output distortions, for sinusoidal output signals.

A conventional Class AB circuit, named the Monticelli output stage, meets the requirement to maintain gain of the output signal during zero load current conditions. The Monticelli output stage generates the output signal based on contributions of an N-side circuit (e.g., circuitry including n-channel transistors) and a P-side circuit (e.g., circuitry including p-channel transistors). The N-side circuit includes a N-side driver and an N-side supporting circuit. The N-side driver includes an N-channel transistor configured to sink current from an output terminal to a common potential (e.g., ground). The P-side circuit includes a P-side driver and a P-side supporting circuit. The P-side driver includes a P-channel transistor configured to source current from a voltage supply VDD to the output terminal. The method of sourcing and sinking current from the output terminal using two drivers includes a shoot-through current. The shoot-through current occurs when both the N-side driver and the P-side driver are enabled to source and sink current, such that the current may flow from voltage supply VDD to common potential (e.g., ground). Reducing the shoot-through current reduces the no-load supply current dissipation by the circuitry.

The Monticelli output stage P-side driver further includes a supporting P-channel transistor. The supporting P-channel transistor includes a control terminal and a first current terminal configured to be a self-biased transistor by connecting the control terminal to the first current terminal. In order for a Monticelli output stage to operate properly as a Class AB output stage, the P-channel transistor of the P-side driver should be matched to the supporting P-channel transistor, and the voltage supply VDD should be approximately 2.2 volts to 2.4 volts. This minimum supply voltage limits the possible usage of the Monticelli output stage to applications supporting this minimum voltage requirement. Circuits using operational amplifiers that implement Class AB operation may include voltage supplies (e.g., batteries) that supply 1.8 volts, which requires the output stage to operate at 1.7 volts or lower. The Monticelli output stage may not be used with a supply voltage lower than approximately 2.2 volts.

Circuits using operational amplifiers that operate for extended periods of time often experience output signal distortions due to NBTI. NBTI may result from changes in the threshold voltages of aging P-channel transistors. Circuits relying on multiple drivers, such as the Monticelli output stage, are impacted by NBTI effects on P-channel transistors used to drive the output signal. The Monticelli output stage exhibits increased operational variations from NBTI effects due to the reliance of matching the P-channel transistor driving the output signal to the supporting P-channel transistor.

The amplifier output stage circuit described herein, remains operational using a low voltage supply, such as applications utilizing batteries that supply voltages less than approximately 2.2 volts. The amplifier output stage circuit of some example embodiments may be configured to counter NBTI effects on a P-channel transistor using a feedback circuit to reduce the impact of NBTI effects over time and remove the need to match transistors. The amplifier output stage of some example embodiments may be configured as a Class AB output stage.

Figure 1:
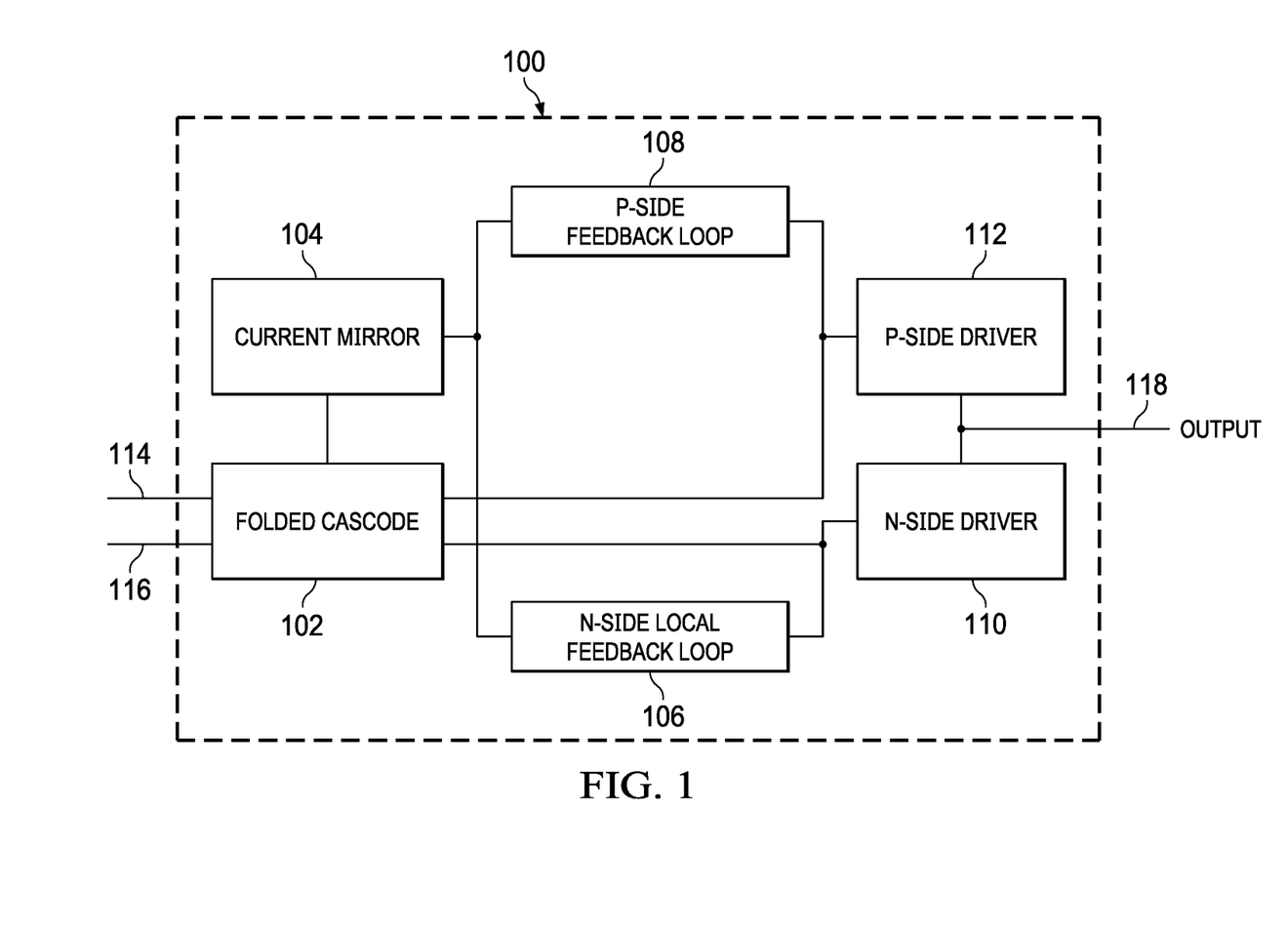
FIG. 1 is a block diagram of an example amplifier output stage including circuitry to enable Class AB operation and circuitry to reduce NBTI effects.

FIG. 1 is a block diagram of an example amplifier output stage 100 including circuitry to enable Class AB operation and circuitry to reduce NBTI effects. In the example of FIG. 1, the amplifier output stage 100 includes an example folded cascode circuit 102, an example current mirror circuit 104, an example N-side feedback loop circuit 106, an example P-side feedback loop circuit 108, an example N-side driver circuit 110, and an example P-side driver circuit 112. The folded cascode circuit 102 may be configured to include a first example input signal 114 and a second example input signal 116. The input signals 114 and 116 may be the output of an initial amplifier stage. The initial amplifier stage may receive amplifier input signals as an input and output the input signals 114 and 116. The input signals 114 and 116 may be configured to represent a differential signal (e.g., a first signal and a second signal 180 degrees out of phase of the first signal).

In the example of FIG. 1, the folded cascode circuit 102 is coupled to the current mirror circuit 104, the N-side feedback loop circuit 106, the P-side feedback loop circuit 108, the N-side driver circuit 110, and the P-side driver circuit 112. The current mirror circuit 104 is coupled to the N-side feedback loop circuit 106 and the P-side feedback loop circuit 108. The N-side feedback loop circuit 106 is coupled to the N-side driver circuit 110. The P-side feedback loop circuit 108 is coupled to the P-side driver circuit 112. The N-side driver circuit 110 is coupled to the P-side driver circuit 112 through an example output terminal 118 (which, in some embodiments, is the output of the multistage amplifier and/or comparator).

In example operation, the amplifier output stage 100 receives an input to the folded cascode circuit 102 from the initial amplifier stage, such that the input to the amplifier output stage 100 may reflect the amplifier operations. The folded cascode circuit 102 enables the input signals 114 and 116 to be currents of a magnitude smaller than the input stage of the operational amplifier. Advantageously, the folded cascode circuit 102 configuration results in reduced noise in a folded cascode output of the folded cascode circuit 102 compared to the overall noise.

In example operation, the N-side feedback loop circuit 106 controls the minimum current of the N-side driver circuit 110. The P-side feedback loop circuit 108 controls the minimum current of the P-side driver circuit 112. The P-side feedback loop circuit 108 controls the operation of the P-side driver circuit 112, such that the P-side feedback loop circuit 108 ensures operation of the P-side driver circuit 112 at increased load currents. Advantageously, the N-side feedback loop circuit 106 includes a single inversion to enable the amplifier output stage 100 to have increased speed of operation, stability, and enable Class AB operation. Advantageously, the P-side feedback loop circuit 108 includes a single inversion to enable the amplifier output stage 100 to have increased speed of operation, stability, and enable Class AB operation.

Figure 2:
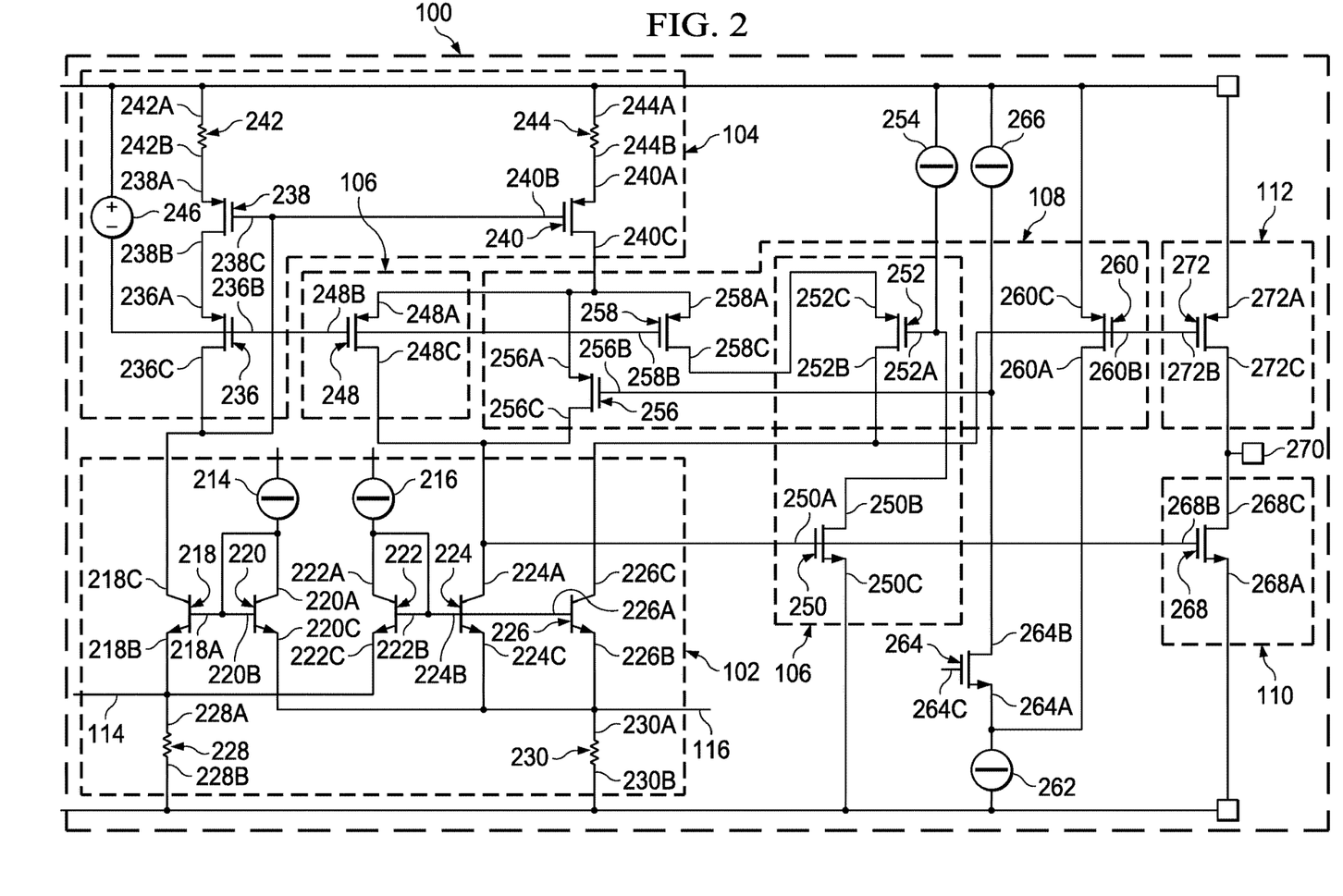
FIG. 2 is a schematic diagram of the amplifier output stage of FIG. 1 including example implementation of circuitry to enable Class AB operation and circuitry to reduce NBTI effects.

FIG. 2 is a schematic diagram of an example implementation of the amplifier output stage 100 of FIG. 1. In the example of FIG. 2, the amplifier output stage 100 of FIG. 1 includes the folded cascode circuit 102, the current mirror circuit 104, the N-side feedback loop circuit 106, the P-side feedback loop circuit 108, the N-side driver circuit 110, and the P-side driver circuit 112.

In the example of FIG. 2, the folded cascode circuit 102 includes a first example current source 214, a second example current source 216, a first example transistor 218, a second example transistor 220, a third example transistor 222, a fourth example transistor 224, a fifth example transistor 226, a first example resistor 228, and a second example resistor 230.

The first transistor 218 is an NPN bipolar junction transistor (BJT). Alternatively, the first transistor 218 may be an N-channel Metal-oxide-semiconductor field-effect transistor (MOSFET), an N-channel field-effect transistor (FET), an N-channel insulated-gate bipolar transistor (IGBT), an N-channel junction field effect transistor (JFET), P-channel MOSFET, a P-channel FET, a P-channel IGBT, a P-channel JFET, or an PNP BJT. The second transistor 220 is an NPN BJT. Alternatively, the second transistor 220 may be an N-channel MOSFET, an N-channel FET, an N-channel IGBT, an N-channel JFET, P-channel MOSFET, a P-channel FET, a P-channel IGBT, a P-channel JFET, or an PNP BJT. The third transistor 222 is an NPN BJT. Alternatively, the third transistor 222 may be an N-channel MOSFET, an N-channel FET, an N-channel IGBT, an N-channel JFET, P-channel MOSFET, a P-channel FET, a P-channel IGBT, a P-channel JFET, or an PNP BJT. The fourth transistor 224 is an NPN BJT. Alternatively, the fourth transistor 224 may be an N-channel MOSFET, an N-channel FET, an N-channel IGBT, an N-channel JFET, P-channel MOSFET, a P-channel FET, a P-channel IGBT, a P-channel JFET, or an PNP BJT. The fifth transistor 226 is an NPN BJT. Alternatively, the fifth transistor 226 may be an N-channel MOSFET, an N-channel FET, an N-channel IGBT, an N-channel JFET, P-channel MOSFET, a P-channel FET, a P-channel IGBT, a P-channel JFET, or an PNP BJT.

In the example of FIG. 2, the first current source 214 is coupled between a voltage supply and a first current terminal 220A of the second transistor 220. A current terminal is a reference to a transistor terminal (e.g., drain terminal, source terminal, emitter terminal, collector terminal, etc.) that allows current to flow either into the transistor or out of the transistor during operation that enables the transistor. The first current source 214 is coupled to a control terminal 218A of the first transistor 218. A control terminal is a reference to a transistor terminal (e.g., gate terminal, base terminal, etc.) that controls the operation of the transistor and determines if the transistor is conducting. The control terminal 218A of the first transistor 218 is coupled to a control terminal 220B of the second transistor 220. A second current terminal 220C of the second transistor 220 is coupled to the second input signal 116. A first terminal 230A of the second resistor 230 is coupled to the second input signal 116.

In the example of FIG. 2, the second current source 216 is coupled between a voltage supply and a first current terminal 222A of the third transistor 222. The second current source 216 is coupled to a control terminal 224B of the fourth transistor 224. The control terminal 224B of the fourth transistor 224 is coupled to the control terminal 222B of the third transistor 222 and to control terminal 226A of the fifth transistor 226. A second current terminal 222C of the third transistor 222 is coupled to the first input signal 114, and first current terminal 218B of the first transistor 218 is coupled to the first input signal 114. A second current terminal 224C is coupled to the second input signal 116. A first current terminal 226B is coupled to the second input signal 116. A first terminal 228A of the first resistor 228 is coupled to the first input signal 114. A second terminal 228B of the first resistor 228 is coupled to a second terminal 230B of the second resistor 230.

In the example of FIG. 2, the current mirror circuit 104 includes an example sixth transistor 236, an example seventh transistor 238, an example eighth transistor 240, a third example resistor 242, a fourth example resistor 244, and a first example voltage source 246. The sixth transistor 236 is a P-channel MOSFET. Alternatively, the sixth transistor 236 may be a P-channel FET, a P-channel IGBT, a P-channel JFET, or an PNP BJT. The seventh transistor 238 is a P-channel MOSFET. Alternatively, the seventh transistor 238 may be a P-channel FET, a P-channel IGBT, a P-channel JFET, or an PNP BJT. The eighth transistor 240 is a P-channel MOSFET. Alternatively, the eighth transistor 240 may be a P-channel FET, a P-channel IGBT, a P-channel JFET, or an PNP BJT.

In the example of FIG. 2, a first terminal 242A of the third resistor 242 is coupled to a first terminal 244A of the fourth resistor 244. A second terminal 242B of the third resistor 242 is coupled to a first current terminal 238A of the seventh transistor 238. A second current terminal 238B of the seventh transistor 238 is coupled to a first current terminal 236A of the sixth transistor 236. A control terminal 236B of the sixth transistor 236 is coupled to the first voltage source 246. A second current terminal 236C of the sixth transistor 236 is coupled to a control terminal 238C of the seventh transistor 238. A second terminal 244B of the fourth resistor 244 is coupled to a first current terminal 240A of the eighth transistor 240. A control terminal 240B of the eighth transistor 240 is coupled to the control terminal 238C of the seventh transistor 238. A second current terminal 218C of the first transistor 218 is coupled to the second current terminal 236C of the sixth transistor 236 and to the control terminal 238C of the seventh transistor 238.

In the example of FIG. 2, an example N-side feedback loop circuit 106 includes a ninth example transistor 248, a tenth example transistor 250, and an eleventh example transistor 252. The ninth transistor 248 is a P-channel MOSFET. Alternatively, the ninth transistor 248 may be a P-channel FET, a P-channel IGBT, a P-channel JFET, or an PNP BJT. The tenth transistor 250 is a N-channel MOSFET. Alternatively, the tenth transistor 250 may be a N-channel FET, a N-channel IGBT, a N-channel JFET, or an NPN BJT. The eleventh transistor 252 is a P-channel MOSFET. Alternatively, the eleventh transistor 252 may be a P-channel FET, a P-channel IGBT, a P-channel JFET, or an PNP BJT.

In the example of FIG. 2, a first current terminal 248A of the ninth transistor 248 is coupled to a second current terminal 240C of the eighth transistor 240. A control terminal 248B of the ninth transistor 248 is coupled to the control terminal 236B of the sixth transistor 236. A second current terminal 248C of the ninth transistor 248 is coupled to a first current terminal 224A of the fourth transistor 224. A control terminal 250A of the tenth transistor 250 is coupled to the first current terminal 224A of the fourth transistor 224. A first current terminal 250B of the tenth transistor 250 is coupled to a control terminal 252A of the eleventh transistor 252. The control terminal 252A of the eleventh transistor 252 is coupled to a third example current source 254. A first current terminal 252B of the eleventh transistor 252 is coupled to a second current terminal 226C of the fifth transistor 226.

In the example of FIG. 2, the P-side feedback loop circuit 108 includes the eleventh transistor 252, a twelfth example transistor 256, a thirteenth example transistor 258, and a fourteenth example transistor 260. The twelfth transistor 256 is a P-channel MOSFET. Alternatively, the twelfth transistor 256 may be a P-channel FET, a P-channel IGBT, a P-channel JFET, or an PNP BJT. The thirteenth transistor 258 is a P-channel MOSFET. Alternatively, the thirteenth transistor 258 may be a P-channel FET, a P-channel IGBT, a P-channel JFET, or an PNP BJT. The fourteenth transistor 260 is a P-channel MOSFET. Alternatively, the fourteenth transistor 260 may be a P-channel FET, a P-channel IGBT, a P-channel JFET, or an PNP BJT.

In the example of FIG. 2, a first current terminal 256A of the twelfth transistor 256 is coupled to the second current terminal 240C of the eighth transistor 240. A first current terminal 258A of the thirteenth transistor 258 is coupled to the first current terminal 256A of the twelfth transistor 256. A control terminal 258B of the thirteenth transistor is coupled to the control terminal 248B of the ninth transistor 248. A second current terminal 252C of the eleventh transistor 252 is coupled to a second current terminal 258C of the thirteenth transistor 258. A first current terminal 260A of the fourteenth transistor 260 is coupled to a fourth example current source 262 and to a first current terminal 264A of a fifteenth transistor 264. A second current terminal 264B of the fifteenth transistor 264 is coupled to a fifth current source 266. A signal may be coupled to a control terminal 264C of the fifteenth transistor 264 to enable cascode control. A control terminal 256B of the twelfth transistor 256 is coupled to the second current terminal 264B of the fifteenth transistor 264 and to current source 266. A second current terminal 256C of the twelfth transistor 256 is coupled to the second current terminal 224C of the fourth transistor 224 and to current terminal 248C. A control terminal 260B of the fourteenth transistor 260 is coupled to the second current terminal 226C of the fifth transistor 226. A second current terminal 260C of the fourteenth transistor 260 is coupled to the first terminal 244A of the fourth resistor 244.

In the example of FIG. 2, the N-side driver circuit 110 includes a sixteenth example transistor 268. The sixteenth transistor 268 is a N-channel MOSFET. Alternatively, the sixteenth transistor 268 may be a N-channel FET, a N-channel IGBT, a N-channel JFET, or an NPN BJT.

In the example of FIG. 2, a first current terminal 268A of the sixteenth transistor 268 is coupled to the second terminal 230B of the second resistor 230. A control terminal 268B of the sixteenth transistor 268 is coupled to the second current terminal 224C of the fourth transistor 224 and to control terminal 250A. A second current terminal 268C of the sixteenth transistor 268 is coupled to an example output terminal 270 and to current terminal 272C.

In the example of FIG. 2, the P-side driver circuit 112 includes a seventeenth example transistor 272. The seventeenth transistor 272 is a P-channel MOSFET. Alternatively, the seventeenth transistor 272 may be a P-channel FET, a P-channel IGBT, a P-channel JFET, or an PNP BJT.

In the example of FIG. 2 a first current terminal 272A of the seventeenth transistor 272 is coupled to the first terminal 244A of the fourth resistor 244. A control terminal 272B of the seventeenth transistor 272 is coupled to the first current terminal 252B of the eleventh transistor 252, control terminal 260B and current terminal 226C. A second current terminal 272C of the seventeenth transistor 272 is coupled to the output terminal 270.

In some examples, the amplifier output stage 100 is implemented as a single integrated circuit (IC) (such as circuitry implemented on a single semiconductor die or on multiple die but within a single IC package). In other embodiments, amplifier output stage 100 is incorporated with one or more additional stages of an amplifier and/or comparator. For example, the folded cascode circuit 102 and the current mirror circuit 104 may be included on the same semiconductor die. In some examples, the amplifier output stage 100 may be implemented by two or more ICs in a single IC package to implement a multi-chip module (MCM). In some examples, the amplifier output stage 100 may be implemented by two or more ICs (such as two or more IC packages). For example, the folded cascode circuit 102 and the current mirror circuit 104 may be on a first die and the N-side feedback loop circuit 106 may be on a second die. In some examples, the folded cascode circuit 102 may be on a first die, the current mirror circuit 104 may be on a second die, and the N-side feedback loop circuit 106 may be on a third die. Alternatively, one or more hardware circuit components (such as the transistors 218-226, the resistors 228 and 230, etc.) of the folded cascode circuit 102 may be included in the N-side feedback loop circuit 106. Alternatively, one or more hardware circuit components (such as the transistors 248-252, etc.) of the N-side feedback loop circuit 106 may be included in the folded cascode circuit 102.

In example operation, a first complementary signal of an example differential signal is coupled to the second input signal 116. A second complementary signal of the differential signal is coupled to the first input signal 114. The current sources 214 and 216 enable a folded cascode current output of the folded cascode circuit 102 to be increased in magnitude compared to the magnitude of a current supplied to the input signals 114 and 116. Advantageously, the use of the current sources 214 and 216 reduce the folded cascode current required and allows for the noise of the folded cascode to be reduced compared to the overall noise of the signal.

In example operation, the N-side feedback loop circuit 106 sets the minimum current that may pass through the sixteenth transistor 268. The N-side feedback loop circuit 106 enables the thirteenth transistor 258 to limit the current passing through the eleventh transistor 252 resulting in a low boundary for the range of the output current on the output terminal 270. The N-side feedback loop circuit 106 may be configured to set the N-side driver 110 limits. The sixteenth transistor 268 may ensure continuous operation at large current outputs by limiting the current passing through the eleventh transistor 252. The P-side feedback loop circuit 108 controls the minimum current that may pass through the seventeenth transistor 272. The P-side feedback loop circuit 108 may disable the twelfth transistor 256 to enable the ninth transistor 248 to ensure the operation of the seventeenth transistor 272. Advantageously, the N-side feedback loop circuit 106 enables the N-side driver circuit 110 to control the current being sunk from the output terminal 270. Advantageously, the P-side feedback loop circuit 108 enables the P-side driver circuit 112 to control the current being sourced to the output terminal 270. Advantageously, the transistor configuration for the N-side feedback loop circuit 106 and the P-side feedback loop circuit 108 includes a single inversion of the signal in each feedback loop at any point during operation.

In example operation, the gate to source voltage ($V_{GS}$) of the seventeenth transistor 272 is equal to that of the fourteenth transistor 260. The coupled second terminal 228B, second terminal 230B, and first current terminal 268A may be coupled to common potential (e.g., ground). The current flowing through the fourteenth transistor 260 is mirrored in the seventeenth transistor 272 as a result of $V_{GS}$ being the same for both devices. The current flowing through the seventeenth transistor 272 is used to determine and adjust for the current variation as a result of NBTI. Advantageously, any current variation due to a $V_{GS}$ shift in the seventeenth transistor 272 is mirrored in the fourteenth transistor 260 and the P-side feedback loop circuit 108 may adjust for current variation due to the NBTI effects.

Figure 3:
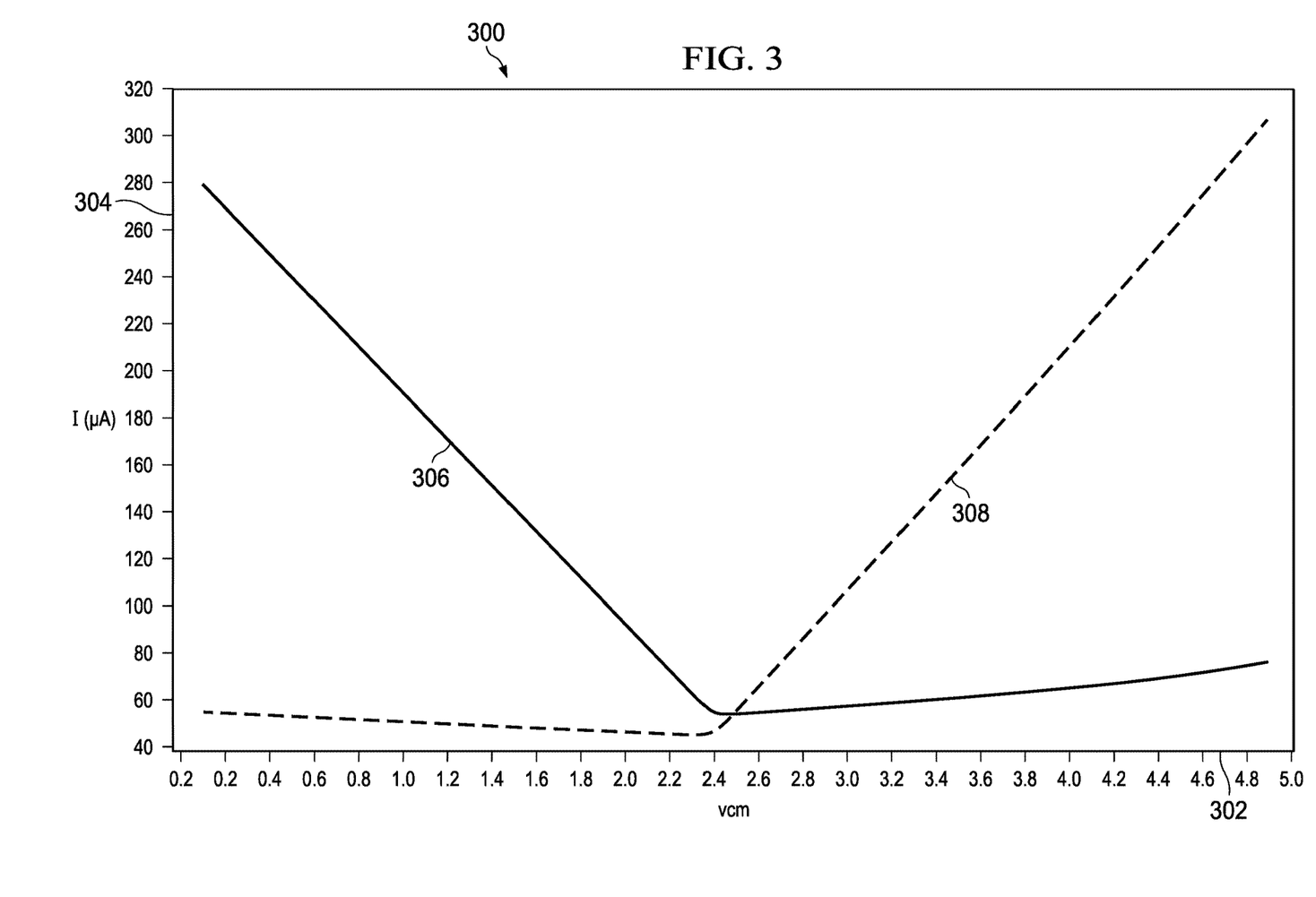
FIG. 3 is an example current versus voltage plot of an example output transistor in an amplifier output stage of FIG. 2.

FIG. 3 is an example current versus voltage plot 300 of an example output transistor in an amplifier output stage 100 of FIG. 2. The current versus voltage plot 300 includes an example vertical current (μA) axis 304, an example horizontal voltage (vcm) axis 302, an example plot of an N-side driver 110 of FIG. 2 current output versus the voltage at the output 306, and an example plot of a P-side driver 112 of FIG. 2 current output versus the voltage at the output 308.

In the example of FIG. 3, the plot of an N-side driver 110 of FIG. 2 current output versus the voltage at the output 306 is determined by the current passing through the sixteenth transistor 268 of FIG. 2 versus the measured voltage drop across approximately a ten-thousand-ohm resistor, coupled between the output terminal 270 of FIG. 2 and a common potential (e.g., ground). The plot of a P-side driver 112 of FIG. 2 current output versus the voltage at the output 308 is determined by the current through the seventeenth transistor 272 of FIG. 2 versus the measured voltage drop across approximately a ten-thousand-ohm resistor, coupled between the output terminal 270 of FIG. 2 and a common potential (e.g., ground).

In the example of FIG. 3, the plot 306 of an N-side driver 110 of FIG. 2 current output versus the voltage at the output 270 of FIG. 2 illustrates higher current at a low output voltage. The plot 306 of an N-side driver 110 of FIG. 2 current output versus the voltage at the output 270 of FIG. 2 trends towards a reduced current magnitude as the output voltage increases. The plot 306 of an N-side driver 110 of FIG. 2 current output versus the voltage at the output begins to increase after the plot 308 of a P-side driver 112 of FIG. 2 current output versus the voltage at the output 270 of FIG. 2 begins to increase. The plot 308 of a P-side driver 112 of FIG. 2 current output versus the voltage at the output 270 of FIG. 2 illustrates a reduced current at a low output voltage. The plot 308 of a P-side driver 112 of FIG. 2 current output versus the voltage at the output decreases as the output voltage increases, but begins to increase as the output voltage increases above around 2.4 vcm.

In the example of FIG. 3, the plot 306 and the plot 308 demonstrate the range of the output of the amplifier output stage 100 of FIGS. 1 and 2. Plots 306 and 308 of driver circuits 110 and 112 of FIGS. 1 and 2, respectively, demonstrates the achievable precision of the output terminal 270 of FIG. 2.

Figure 4A:
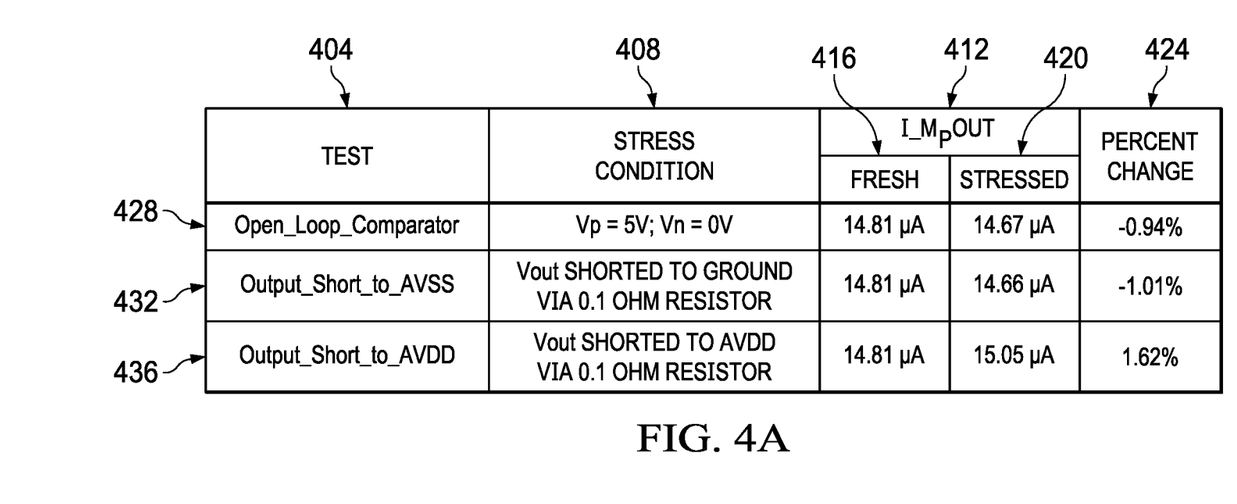
FIG. 4A is a table including performance parameters of an example P-channel driver transistor in an amplifier output stage of FIG. 2, fresh from production and after a 10-year stress simulation.

FIG. 4A is a table illustrating the performance of an example P-side driver 112 of FIG. 2, such as the seventeenth transistor 272. Column 416 illustrates this performance for a P-side driver 112 right after the device is fabricated (labeled as "fresh") and column 420 illustrates this performance for the same device but after a 10-year stress simulation (labeled as "stressed"). The table of FIG. 4A includes an example test column 404, an example stress condition column 408, an example P-side current output column 412, an example fresh P-side current output column 416, an example stressed P-side current output column 420, and an example percent change between the fresh and stressed currents 424.

In the example of FIG. 4A, an open loop comparator test 428 (where terminal 270 is not coupled to additional circuitry) resulted in measuring the current through the fresh P-channel driver to be approximately 14.81 µA, and the current through the stressed P-channel driver to be approximately 14.67 µA. The open loop comparator test 428 resulted in an approximate difference of −0.94% between the current of the fresh device and the stressed device.

An output short to $AV_{SS}$ (such as ground) test 432 (where terminal 270 is coupled to a common potential (e.g., ground) through an approximately 0.1-ohm resistor) resulted in the measured current through the fresh P-channel driver to be approximately 14.81 µA, and the measured current through the stressed P-channel driver to be approximately 14.66 µA. The output short to $AV_{SS}$ test 432 resulted in an approximate difference of −1.01% between the current of the fresh device and the stressed device.

An output short to $AV_{DD}$ (such as the supply voltage VDD) test 436 (where terminal 270 is coupled to the supply voltage VDD through an approximately 0.1-ohm resistor) resulted in the measured current through the fresh P-channel driver to be approximately 14.810 µA, and the measured current through the stressed P-channel driver to be approximately 15.05 µA. This is an approximate difference of 1.62%.

Figure 4B:
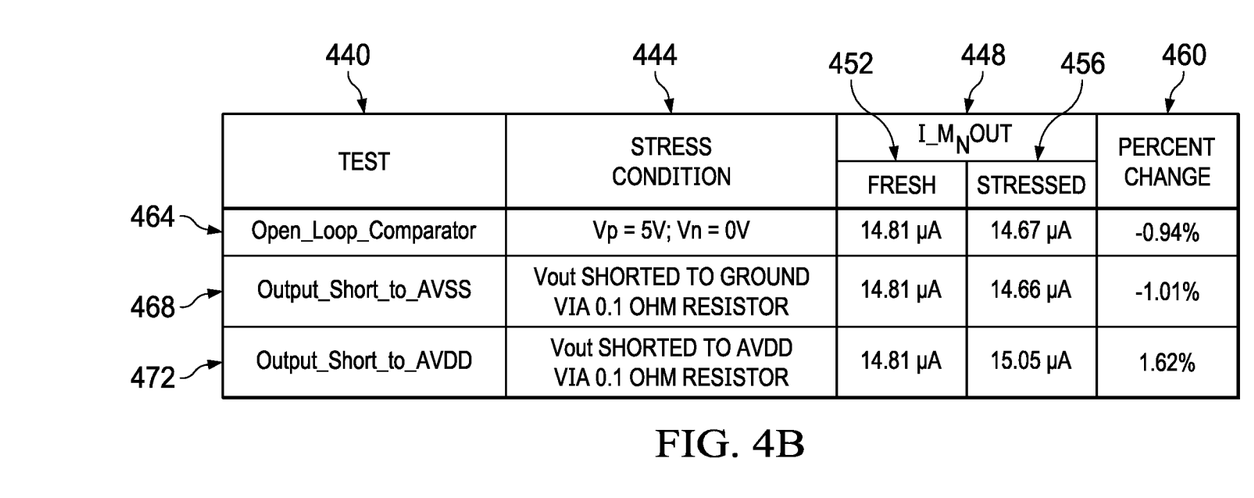
FIG. 4B is a table including performance parameters of an example N-channel driver transistor in an amplifier output stage of FIG. 2, fresh from production and after a 10-year stress simulation.

FIG. 4B is a table including performance parameters of the N-side driver 110 of FIG. 2. FIG. 4B is a table of the N-side driver 110 of FIG. 2, such as the sixteenth transistor 268 from FIG. 2, in an amplifier output stage 100 from FIG. 1. In the example of FIG. 4B, column 452 corresponds to the measurements of a fresh from production application (labeled as "fresh") and column 456 corresponds to an after a 10-year stress simulation application (labeled as "stressed"). The table of FIG. 4B includes an example test column 440, an example stress condition column 444, an example N-side current output column 448, an example fresh N-side current output column 452, an example stressed N-side current output column 456, and an example percent change between the fresh and stressed currents 460.

In the example of FIG. 4B, an open loop comparator test 464 (where terminal 270 is not coupled to additional circuitry) resulted in measuring the current through the fresh N-channel, to be approximately 14.81 µA and the current through the stressed N-channel driver, to be approximately 14.67 µA. The open loop comparator test 464 resulted in an approximate difference of −0.94% between the current of the fresh device and the stressed device.

An output short to $AV_{SS}$ (such as ground) test 468 (where terminal 270 is coupled to a common potential (e.g., ground) through an approximately 0.1-ohm resistor) resulted in the measured current through the fresh N-channel driver, to be approximately 14.81µA, and the measured current through the stressed N-channel driver to be approximately 14.66 µA. The output short to $AV_{SS}$ test 468 resulted in an approximate difference of −1.01% between the current of the fresh device and the stressed device.

A output short to $AV_{DD}$ (such as the supply voltage) test 472 (where terminal 270 is coupled to the supply voltage VDD through an approximately 0.1-ohm resistor) resulted in the measured current, through the fresh N-channel driver, to be approximately 14.810 µA, and the measured current through the stressed N-channel driver to be approximately 15.05 µA. This is an approximate difference of 1.62%.

Figure 5:
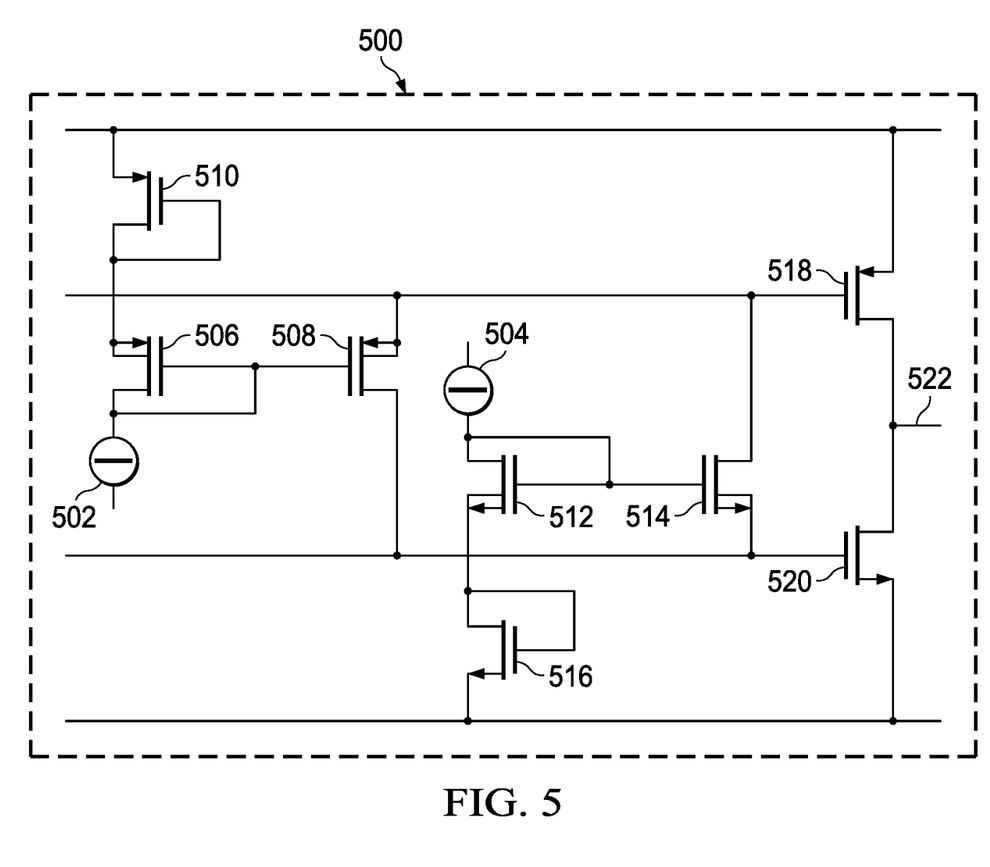
FIG. 5 is a schematic diagram of a Class AB circuit 500 that requires a higher minimum supply opposed to the amplifier output stage 100 of FIG. 1.

FIG. 5 is a schematic diagram of a Class AB circuit 500 that requires a higher minimum supply opposed to the amplifier output stage 100 of FIG. 1. The high minimum supply Class AB circuit 500 may be referred to as the Monticelli Class AB output stage. The high minimum supply Class AB circuit 500 includes a sixth example current source 502, a seventh example current source 504, an eighteenth example transistor 506, a nineteenth example transistor 508, a twentieth transistor 510, a twenty-first example transistor 512, a twenty-second example transistor 514, a twenty-third example transistor 516, a twenty-fourth example transistor 518, a twenty-fifth example transistor 520, and a second example output terminal 522. The transistors 506-510 and 518 are p-channel MOSFETs. The transistors 512-520 are N-channel MOSFETs.

In the example of FIG. 5, the sixth current source 502 is coupled between the eighteenth transistor 506 and common potential (e.g., ground). The eighteenth transistor 506 is coupled to the nineteenth transistor 508. The eighteenth transistor 506 is coupled to the twentieth transistor 510. The twentieth transistor 510 is configured to be self-biased. The nineteenth transistor 508 is coupled to the twenty-fourth transistor 518. The seventh current source 504 is coupled between the voltage supply VDD and the twenty-first transistor 512. The twenty-first transistor 512 is coupled to the twenty-second transistor 514. The twenty-first transistor 512 is coupled to the twenty-third transistor 516. The twenty-second transistor 514 is coupled to the twenty-fourth transistor 518. The twenty-second transistor 514 is coupled to the twenty-fifth transistor 520. The nineteenth transistor 508 is coupled to the twenty-second transistor 514. The twenty-fourth transistor 518 is coupled to the twenty-fifth transistor 520 through the second output terminal 522. The twenty-fourth transistor 518 is controlled by a first output of the initial amplifier stage. The twenty-fifth transistor 520 is controlled by a second output of the initial amplifier stage.

In example operation, the accuracy of the Class AB operation of the high minimum supply Class AB circuit 500 depends on the matching of the twentieth transistor 510 to the twenty-fourth transistor 518. The accuracy of the Class AB operation of the high minimum supply Class AB circuit 500 further depends on the matching of twenty-third transistor 516 to the twenty-fifth transistor 520. Unlike the amplifier output stage 100 of FIG. 1, the high minimum supply Class AB circuit 500 relies on the $V_{GS}$ values for the transistor driving the output current (e.g., the twenty-fourth transistor 518) and the supporting sense transistor (e.g., the twentieth transistor 510). The different $V_{GS}$ values of the driving transistors and the supporting sense transistors results in unstable or altered functionality after NBTI effects the voltage threshold of these transistors.

Figure 6:
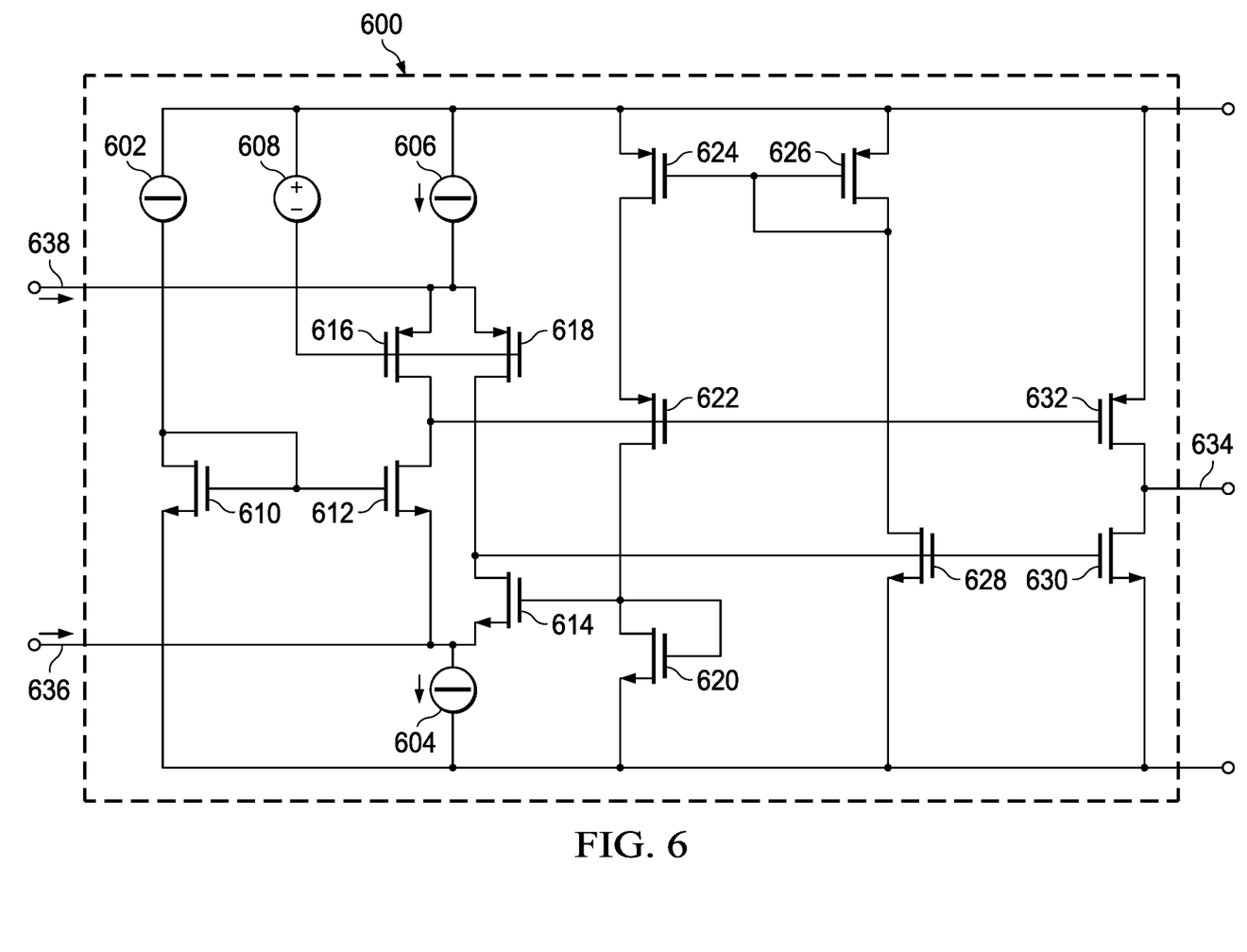
FIG. 6 is a schematic diagram of a Class AB circuit 600 that requires a minimum input current.

FIG. 6 is a schematic diagram of a Class AB circuit 600 that requires a minimum input current. In the example of FIG. 6, the minimum selector Class AB circuit 600 includes an eighth example current source 602, a ninth example current source 604, a tenth example current source 606, a second example voltage source 608, a twenty-sixth example transistor 610, a twenty-seventh example transistor 612, a twenty-eighth example transistor 614, a twenty-ninth example transistor 616, a thirtieth example transistor 618, a thirty-first example transistor 620, a thirty-second example transistor 622, a thirty-third example transistor 624, a thirty-fourth example transistor 626, a thirty-fifth example transistor 628, a thirty-sixth example transistor 630, a thirty-seventh example transistor 632, a third example output terminal 634, a first example input terminal 636, and a second example input terminal 638. The transistors 610-614,

620, 628, and 630 are N-channel MOSFETs. The transistors 616, 618, 622-626, and 632 are P-channel MOSFETs.

In the example of FIG. 6, the eighth current source 602 is coupled between the supply voltage VDD and the twenty-sixth transistor 610. The twenty-sixth transistor 610 is self-biased. The twenty-sixth transistor 610 is coupled to the twenty-seventh transistor 612. The ninth current source 604 is coupled between the twenty-seventh transistor 612 and the first input terminal 636, and common potential (e.g., ground). The ninth current source 604 is coupled to the twenty-eighth transistor 614. The twenty-seventh transistor 612 is coupled to the twenty-eighth transistor 614. The twenty-seventh transistor 612 is coupled to the twenty-ninth transistor 616. The tenth current source 606 is coupled to the twenty-ninth transistor 616, the thirtieth transistor 618, and the second input terminal 638. The second voltage source 608 is coupled to the twenty-ninth transistor 616 and the thirtieth transistor 618.

In the example of FIG. 6, the twenty-eighth transistor 614 is coupled to the thirty-first transistor 620. The thirty-first transistor 620 is self-biased. The twenty-ninth transistor 616 is coupled to the thirty-second transistor 622. The thirty-first transistor 620 is coupled to the thirty-second transistor 622. The thirty-second transistor 622 is coupled to the thirty-third transistor 624. The thirty-third transistor 624 is coupled to the thirty-fourth transistor 626. The thirty-fourth transistor 626 is self-biased. The twenty-eighth transistor 614 is coupled to the thirty-fifth transistor 628. The thirty-fourth transistor 626 is coupled to the thirty-fifth transistor 628. The thirty-fifth transistor 628 is coupled to the thirty-sixth transistor 630. The twenty-ninth transistor 616 is coupled to the thirty-seventh transistor 632. The thirty-sixth transistor 630 is coupled to the thirty-seventh transistor 632 through the third output terminal 634.

In example operation, the minimum selector Class AB circuit 600 depends on the matching of the thirty-second transistor 622 to the thirty-seventh transistor 632. The accuracy of the Class AB operation of the minimum selector Class AB circuit 600 depends on the matching of thirty-fifth transistor 628 to the thirty-sixth transistor 630. Unlike the amplifier output stage 100 of FIG. 1, the minimum selector Class AB circuit 600 utilizes separate $V_{GS}$ values for the transistor driving the output current (e.g., the thirty-seventh transistor 632) and the supporting sense transistor (e.g., the thirty-second transistor 622). An inaccurate Class AB current may account for approximately 50% to 70% of the total current consumed by an operational amplifier application as the result of the mismatch between the $V_{GS}$ of the transistor driving the output current and the $V_{GS}$ of the supporting sense transistor. The different $V_{GS}$ values of the driving transistors and the supporting sense transistors results in unstable or altered functionality after NBTI effects the voltage threshold of the transistors.

In example operation, the additional transistors involved in the feedback loop from the driver transistors result in large delays in adjusting the output, since there are two more inversions opposed to the amplifier output stage 100 of FIG. 1. The additional inversions reduce the bandwidth of the potential applications, add substantial flicker noise to the output, and cause step settling delays.

Various forms of the term "couple" are used throughout the specification. These terms may cover connections, communications, or signal paths that enable a functional relationship consistent with the description of the present disclosure. For example, if device A generates a signal to control device B to perform an action, in a first example device, A is coupled to device B by direct connection, or in a second example device, A is coupled to device B through intervening component C if intervening component C does not alter the functional relationship between device A and device B such that device B is controlled by device A via the control signal generated by device A.

Consistent with the present disclosure, the term "configured to" describes the structural and functional characteristics of one or more tangible non-transitory components. For example, a device that is "configured to" perform a function mean that the device has a particular configuration that is designed or dedicated for performing a certain function. A device is "configured to" perform a certain function if such a device includes tangible non-transitory components that can be enabled, activated, or powered to perform that certain function. While the term "configured to" may encompass being configurable, this term is not limited to such a narrow definition. Thus, when used for describing a device, the term "configured to" does not require the described device to be configurable at any given point of time.

Moreover, the term "example" is used herein to mean serving as an instance, illustration, etc., and not necessarily as advantageous. Also, although the disclosure has been shown and described with respect to one or more implementations, equivalent alterations and modifications will be apparent upon a reading and understanding of this specification and the annexed drawings. All such modifications and alterations are fully supported by the disclosure and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in an example particular order, this does not require that such operations be performed in the example particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above does not require such separation in all embodiments.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While some example embodiments suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

The following claims are hereby incorporated into this Detailed Description by this reference, with each claim standing on its own as a separate embodiment of the present disclosure.

What is claimed is:

1. A circuit comprising:
    a first transistor having first and second terminals and a control terminal;
    a second transistor having first and second terminals and a control terminal, the first terminal of the second transistor coupled to the control terminal of the first transistor;
    a third transistor having first and second terminals and a control terminal;
    a fourth transistor having first and second terminals and a control terminal, the first terminal of the third transistor coupled to the control terminal of the fourth transistor;
    a first feedback circuit coupled to the first terminal of the fourth transistor; and
    a second feedback circuit coupled to the first terminal of the fourth transistor.

2. The circuit of claim 1, wherein the first feedback circuit includes:
    a fifth transistor having a first terminal coupled to the second feedback circuit and having a control terminal coupled to the control terminal of the third transistor and to the control terminal of the fourth transistor.

3. The circuit of claim 2, wherein the second terminals of the second and fifth transistors are directly connected, and the control terminals of the first and second transistors are directly connected.

4. The circuit of claim 2, wherein the circuit further includes:
    a sixth transistor having first terminal and second terminals, the second terminal of the sixth transistor coupled to the first terminal of the first transistor;
    a seventh transistor having first and second terminals, the first terminal of the sixth coupled to the second terminal of the seventh transistor; and
    an eighth transistor having first and second terminals, and a control terminal, the control terminal of the eighth transistor coupled to the control terminal of the seventh transistor.

5. The circuit of claim 4, further comprising a ninth transistor having a first terminal coupled to the second terminal of eight transistor, having a second terminal coupled to the first terminal of the fourth transistor, and having a control terminal coupled to the control terminal of the sixth transistor.

6. The circuit of claim 1, wherein the circuit further includes:
    a fifth transistor having first terminal and second terminals and a control terminal, the control terminal of the fifth transistor coupled to the control terminal of the third transistor, the second terminal of the fifth transistor coupled to the second terminal of the second transistor;
    a sixth transistor having first and second terminals and a control terminal, the second terminal of the sixth transistor coupled to the first terminal of the first transistor; and a seventh transistor having first and second terminals, the second terminal of the seventh transistor coupled to the first terminal of the sixth transistor.

7. The circuit of claim 6, wherein the circuit further includes an eighth transistor having a first terminal coupled to the first terminal of the seventh transistor.

8. The circuit of claim 6, further comprising an eighth transistor having a first terminal coupled to the first terminal of seventh transistor and the control terminal of the seventh transistor, and having a control terminal coupled to the control terminal of the seventh transistor.

9. The circuit of claim 1, further comprising:
a first current source having a terminal coupled to the control terminal of the first transistor; and
a second current source having a terminal coupled to the control terminal of the fourth transistor.

10. The circuit of claim 1, wherein:
the first and second transistors are bipolar junction transistors; and
the third and fourth transistors are bipolar junction transistors.

11. A circuit comprising:
a first transistor having first and second terminals and a control terminal;
a second transistor having first and second terminals and a control terminal, the control terminal of the second transistor coupled to the control terminal of the first transistor;
a third transistor having first and second terminals and a control terminal;
a fourth transistor having first and second terminals and a control terminal, the first terminal of the third transistor coupled to the control terminal of the fourth transistor;
a fifth transistor having a control terminal directly connected to the control terminal of the fourth transistor;
a sixth transistor having first terminal and second terminals, the second terminal of the sixth transistor coupled to the first terminal of the first transistor;
a seventh transistor having first and second terminals, the second terminal of the seventh transistor coupled to the first terminal of the first transistor; and
an eighth transistor having first and second terminals, the first terminal of the eighth transistor coupled to the first terminal of the seventh transistor, the control terminal of the eighth transistor coupled to the control terminal of the seven transistor.

12. The circuit of claim 11, further comprising:
a first current source having a terminal coupled to the control terminal of the first transistor; and
a second current source having a terminal coupled to the control terminal of the fourth transistor.

13. The circuit of claim 11, wherein the circuit further includes:
a ninth transistor having first terminal and second terminals and a control terminal, the control terminal of the ninth transistor coupled to the control terminal of the sixth transistor, the second terminal of the ninth transistor coupled to the first terminal of the fourth transistor; and
a tenth transistor having first and second terminals, and a control terminal the control terminal of the tenth transistor coupled to the first terminal of the fourth transistor.

14. The circuit of claim 11, wherein:
the first and second transistors are bipolar junction transistors; and
the third and fourth transistors are bipolar junction transistors.

* * * * *